United States Patent [19]

Carleton

[11] 3,786,492

[45] Jan. 15, 1974

[54] COMPENSATION APPARATUS AND METHOD

[75] Inventor: James T. Carleton, Pittsburgh, Pa.

[73] Assignee: Westinghouse Electric Corporation, Pittsburgh, Pa.

[22] Filed: July 5, 1972

[21] Appl. No.: 269,000

[52] U.S. Cl. .................... 340/347 CC, 340/347 NT

[51] Int. Cl. .................................... H03k 13/02

[58] Field of Search .............. 340/347 NT, 347 CC, 340/347 AD; 318/620, 621; 235/150.51, 183; 324/99 D

[56] References Cited

UNITED STATES PATENTS 3,678,500 7/1972 Bauer .......................... 340/347 NT

*Primary Examiner*—Thomas A. Robinson
*Attorney*—F. H. Henson et al.

[57] ABSTRACT

A Compensation apparatus and method which provides either gain, lead, lag or lead-lag compensation utilizing a single step of integration. An error signal generated as the difference between the applied signal and the output of an integrator serves as the input to a variable gain stage. The output of the variable gain stage is the input to the integrator. Lead and lag jumpers selectively connect the outputs of the variable gain stage and the integrator, respectively, to the inputs of an output summer. The lead time constant is determined by the time constant of the integrator and the lag time constant is equal to the lead time constant divided by the gain of the variable gain stage. Gain compensation is obtained by utilizing both the lead and lag jumpers and setting the variable gain to unity. The hybrid network combines a digital integrator having an extended range of easily selectable time constants with analog gain and summing circuits.

24 Claims, 7 Drawing Figures

COMPENSATION APPARATUS AND METHOD

CROSS-REFERENCE TO RELATED APPLICATIONS

1. The commonly owned application entitled "Digital-to-Analog Conversion Apparatus and Method", Ser. No. 200,367, filed in the name of James Franklin Sutherland on Nov. 19, 1971.

2. My application entitled "Digital Integration Apparatus and Method" assigned to the same assignee as this application and identified as W.E. Case No. 43,902 Ser. No. 268,951, filed concurrently with this application on July 5, 1972.

3. The application of Thomas Scwhalenstocker entitled "Voltage to Pulse Converter" assigned to the same assignee as this application and identified as W.E. Case No. 43,903 Ser. No. 268,949, filed concurrently with this application on July 5, 1972.

BACKGROUND OF THE INVENTION

Field of the Invention

This invention relates to apparatus and methods for providing compensation for electrical networks, and more particularly, for providing the types of compensation known as lead, lag and lead-lag utilized in instrumentation circuitry.

Prior Art

Compensation is used in electrical circuits to improve such operating characteristics as linearity, response time, and stability. The basic types of compensation circuits generate output signals which are either gain, lag, or lead functions of the input signal. The gain function merely alters the amplitude of the input signal by a factor which may be more or less than unity. The lag function provides a gradual change in output for a change in input and therefore is sometimes referred to as an integral function. The lead function, which produces a large initial output signal which exponentially decays, is similar in many respects to a derivative function and is sometimes referred to as such.

Another convenient characterization of compensation circuits is their frequency response. The ideal gain function applies the same gain factor to all frequencies. On the other hand, the lag network attenuates the higher frequencies while the lead network attenuates the lower frequencies. This suggests that the basic compensation functions may be combined to provide a desired response. Two of the basic functions, or all three, may be combined for a particular application. The lead-lag network is a widely used combination of the basic lead and lag functions.

The gain function can be produced electrically by a broad band amplifier or, where the gain is less than unity, by a simple voltage divider. A passive lag circuit is constructed by applying the input voltage to a capacitor through a resistor. The passive lag circuit is realized by applying the input voltage across a resistor through a capacitor. Such circuits are subject to limitations such as drift, non-linearities, short time constants and dependence upon load impedances; however, they are entirely satisfactory for a great many applications.

An active lag network can be produced by providing a resistor and capacitor in parallel in the feedback loop of an operational amplifier. An active lead circuit may be constructed by inserting a capacitor in series with the input resistor of an operational amplifier having a resistive feedback loop. The lead-lag circuit is produced by inserting a capacitor-resistor parallel combination in both the input and feedback circuits of an operational amplifier.

Compensation circuits have wide application to process control systems where they are used to compensate for the inherent lag in the response of physical processes to changes in inputs. In the classic control system, a measured process variable is compared with a desired value and the error signal is applied to a controller. A control signal generated by the controller as a function of the error signal is used to regulate the energy input to the process through a final control element. The simplest form of controller, the uncompensated off-on type where the final control element is either full on or off, takes advantage of the inherent lag of the process to preclude continuous cycling of the final control element; however, the continual overshooting makes it very inaccurate. The proportional controller uses gain compensation to drive the error signal towards zero, but tends to overshoot and can therefore become unstable. The integral controller uses lag compensation to provide a gradual change in the control element which reduces the response time of the system. The rate controller gives an initial kick to the final control element to initiate the change in the process and also must be carefully designed to preclude instability.

A widely used type of controller combines proportional and integral control while other controllers combine all three control functions. Another approach to compensating for process lag is found in the feed-forward control system wherein a desired change in the measured variable is applied directly to the final control element with proportional gain control, and the final operating point of the final control element is trimmed by the error signal to which integral, and in some instances, derivative compensation have been applied.

Controller compensation may be found in the controller major loop and/or in minor feedback loops. Compensation may also be provided in other portions of the control system. When it is applied to the measured value of the controller variable between the process and the error summing point, its purpose is normally to filter out lower or higher harmonics, such as 60-cycle noise, which might cause the system to become unstable. Compensation may also be applied to the input signal or set point as well. A growing use of compensation network is in process simulators, wherein excessively long time constants, suh as 1,000 seconds or longer, must be duplicated.

The prior art compensation circuits invariably utilized resistor and capacitor combinations to provide the necessary phase shifting. Such circuits are subject to drift due to leakage in the capacitors and inaccuracies caused by temperature effects and aging of the resistors. For this reason, and the fact that it is difficult to obtain accurate values in large resistors and capacitors, the prior art compensation circuits were notably unsatisfactory in generating long time constants. For instance, since ten microfarrads is the practical limit for low leakage capacitors, 100 megohm resistors are required to obtain a time constant of 1,000 seconds ($t = RC$). Such resistors are only available with ten percent accuracy and matching of components adds to the cost.

Furthermore, if a variable time constant is to be provided, additional resistors and/or capacitors must be brought into the prior art circuits. Since the trend in instrumentation is towards integrated circuits, the requirement for a number of bulky capacitors is undesirable. In addition, introduction of capacitance or resistance in discrete steps in the prior art compensation circuits leads to undesirable transients if the change is made with the control system on line.

In the case of the prior art lead-lag circuit, two integrating circuits were required, one in the input circuit to the operational amplifier and a second in the operational amplifier feedback loop. Hence, two sets of resistor-capacitor combinations had to be manipulated if both time constants were to be changed.

SUMMARY OF THE INVENTION

According to the invention, lead, lag or lead-lag, compensation is provided by a single integration. The applied signal is summed in opposition to a feedback signal in an error signal generator. The error signal is applied to the input of a variable gain lead amplifier, the output of which becomes the input to an integrator. The output of the integrator serves as the feedback signal which is applied to the error signal generator. The output of the lead amplifier and the output of the integrator are applied to the inputs of the summing amplifier through lead and lag jumpers respectively.

The signal appearing at the output of the summing amplifier will be a function of the network input signal. The nature of the function is determined by the placement of the jumpers and the settings of the lead and lag time constants. The lead time constant is equal to the time constant of the integrator while the lag time constant is equal to the lead time constant divided by the gain of the lead amplifier. Therefore, even though the lag time constant is derived from the lead time constant, it may be set to a desired value by proper selection of the gain of the lead amplifier.

For a lag or integral function, the lag jumper is inserted and the lead jumper is removed. Conversely, the lead jumper is installed and the lag jumper is removed to generate a lead or derivative function. Both jumpers are installed for the lead-lag and gain functions. The setting of the time constant on the integrator and the setting of the gain of the lead amplifier determine the break points of the lead-lag function. With the gain of the lead amplifier set to unity, a gain function will be generated regardless of the time constant of the integrator.

The output summing amplifier may be provided with selectable bipolar or unipolar limiting and short-circuit protection. In addition, scaling may be provided by applying the input to a variable gain scaling amplifier connected to the input of the error signal generator.

The network is designed for implementation by integrated circuits mounted on printed circuit boards. Preferably, a digital integrator with an easily adjustable time constant is utilized. Such a hybrid combination provides a compact, versatile and easily convertible compensation network having wide application in the instrumentation field.

The invention also embraces the method of applying compensation to an analog signal by summing the analog signal in opposition to a feedback signal, applying gain to the error signal, to generate an amplified error signal, integrating the amplified error signal to generate the feedback signal, and selecting the amplified error signal, the feedback signal or the algebraic sum of the two as the output signal.

BRIEF DESCRIPTION OF THE DRAWINGS

An understanding of the invention can be gained from a reading of the following description, taken in conjunction with the accompanying drawings, in which.

DESCRIPTION OF THE PREFERRED EMBODIMENT

Figure 1:
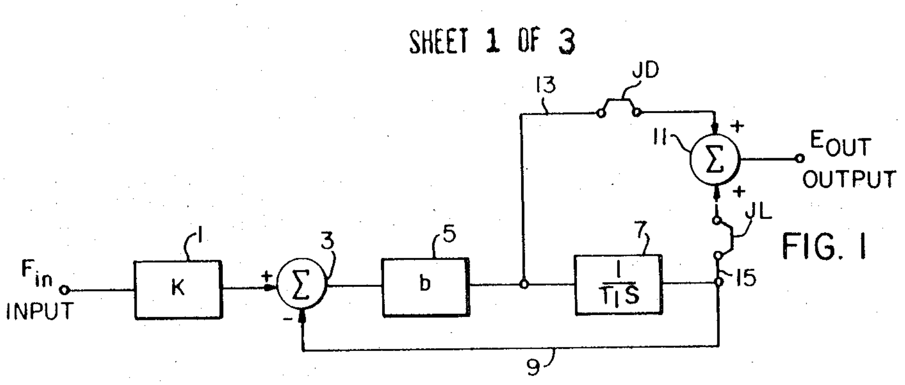
FIG. 1 is a simplified block diagram of a compensation network according to the invention.

Referring to FIG. 1 for a simplified block diagram of a hybrid compensation network embodying the invention, the input signal is applied to a scaling amplifier 1 which provides the positive input to the error signal generator 3. The output of the error signal generator is fed to the input of the variable gain lead amplifier 5. In reality, the error signal generator 3 is the summing junction of an operational amplifier which comprises the variable gain lead amplifier 5. The output of the lead amplifier 5 serves as the input to the integrator 7 and the output of the integrator supplies the feedback signal to the error signal generator 3 through lead 9. The output of the lead amplifier 5 is also applied to one input of the summing amplifier 11 through lead 13 and the lead, or derivative, jumper JD. The output of the integrator is connected to another input of summing amplifier 9 through lead 15 and the lag jumper JL.

THEORETICAL OPERATION

Analysis of the operation of the network illustrated in simplified block diagram form in FIG. 1 can best be understood by considering the Laplace transfer functions of the various configurations of the network. Laplace transforms are convenient mathematical tools for solving linear differential equations describing the operation of a physical system or process. They are integral transforms which convert differential equations with time as the independent variable into algebraic equations, which, when solved, can be transformed back into the time domain to yield the solution to the differential equation.

The Laplace transform of the integrator represented by block 7 is well known to be $1/T_I s$. It is also well known that the transfer function of a system involving feedback is equal to the quotient of the product of the transfer functions of the feed-forward blocks divided by 1 plus the product of the transfer functions of the closed loop blocks. If the jumpers JD and JL are represented by the operators $N_1$ and $N_2$ and N = 1 if the jumper is installed and N=0 if the jumper is removed, the following generalized equation can be written for the circuit of FIG. 1:

$$E_{out} = E_{in}\,[KbN_1/(1 + b/T_1s) + (KbN_2/T_1s)/(1 + b/T_1s)] \quad (1)$$

which may be rearranged and reduced to:

$$E_{out} = E_{in}\,K[(N_1T_1s + N_2)/(1 + T_2s)] \quad (2)$$

where $T_1/b = T_2$.

It can be seen then that for a lead or derivative function where $N_1 = 1$ and $N_2 = 0$, the transfer function becomes:

$$E_{out} = E_{in}\,K\,(T_1s/1 + T_2s) \quad (3)$$

For the lag or integral function where $N_1 = 0$ and $N_2 = 1$, the transfer function becomes:

$$E_{out} = E_{in}\,K\,(1)/(1 + T_2s) \quad (4)$$

For the lead-lag function when both $N_1$ and $N_2 = 1$, the transfer function is:

$$E_{out} = E_{in}\,K\,(1 + T_1s)/(1 + T_2s) \quad (5)$$

It is readily seen that for the latter function, when $b = 1$, $$E_{out} = E_{in}\,K\,(1 + T_1s)/(1 + T_1s) = E_{in}K \quad (6)$$

The response of the network in its various configurations can be appreciated by considering the application of a step function to the input terminal. The Laplace transform for a step function is equal to H/s, where H is the amplitude of the step. Substituting this for $E_{in}$ in equation (3), the response of the network in the lead configuration in terms of the operators is:

$$E_{out} = (KHT_1)/(1 + T_2s) \quad (7)$$

Taking the reverse transform of Eq.(7), the response of the lead network in the time domain is expressed by the following equation:

$$E_{out} = KHbe\ ^{-}t/T_2 \quad (8)$$

A graphical illustration of this equation as a function of time is illustrated in FIG. 2*a*. If the step is introduced at time $t_0$, $E_{out}$ will rise to an amplitude determined by the gain of the scaling amplifier, the amplitude of the step and the gain *b* of the lead amplifier. $E_{out}$ will then decay exponentially to zero at a rate determined by $T_2$ which, it will be recalled, is equal to the time constant of the integrator divided by the gain of the lead amplifier.

The response of the network in the other configurations to a step input can be determined in a similar manner. FIG. 2*b* illustrates that with the lag jumper JL installed and the lead jumper JD removed, $E_0$ will start at zero at $t_0$ and rise exponentially toward an asymptotic value determined by the amplitude of the step and the scaling factor. The rate at which $E_0$ approaches this asymptotic value is determined by the time constant $T_2$.

With both jumpers JD and JL installed, the response of the network to a step input can vary greatly, depending upon the value of *b*, the gain of the lead amplifier. With *b* greater than unity, $E_0$ will go to a high initial value and then decay exponentially to an asymptotic value which will be maintained as long as the step is applied. The response for $b = 2$ is shown in FIG. 2*c* as a solid line. If *b* is less than unity, $E_0$ will have a step of $T_1/T_2$ then rise exponentially to the asymptotic value as illustrated by the dotted curve in FIG. 2*c* for $b = ½$. When *b* equals unity, $E_0$ will follow the step and generate an output step having an amplitude equal to the asymptotic value as determined by the amplitude of the input step and the scaling factor.

Figure 2:
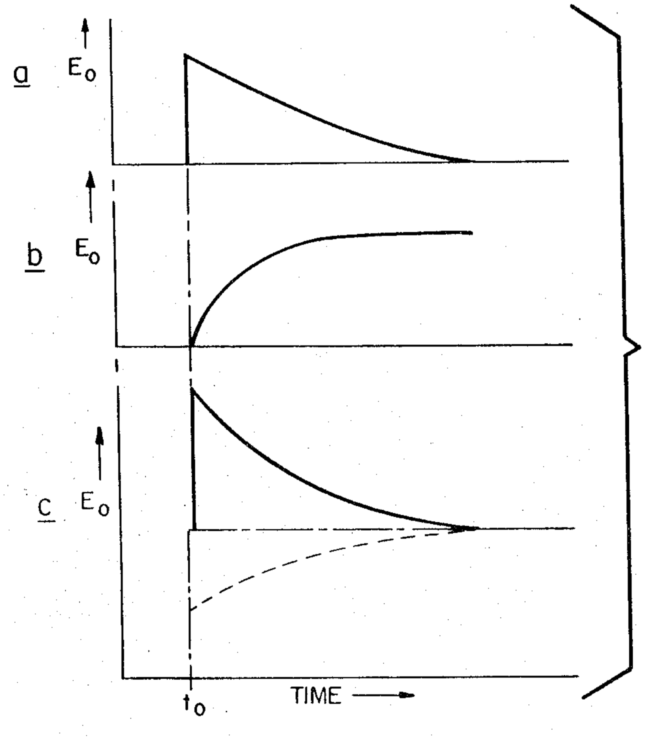
FIGS. 2*a* – 2*c* are waveform diagrams illustrating the response of the network of FIG. 1 under selected conditions.

The curves of FIG. 2 can be used to gain an appreciation of how the network can generate lead, lag or lead-lag outputs using only one integrator. The output of the integrator is illustrated in FIG. 2*b*. Considering that this output is subtracted from the input step in the error signal generator 3, it can be appreciated that the lead signal is realized by subtracting the curve of FIG. 2*b* from a step. Similarly, since the summing amplifier 11 adds the lead and lag signals together, the curve of FIG. 2*c* is obtained by adding the curves of FIGS. 2*a* and *b* together point by point. The relative amplitudes of these two curves, which is a function of *b*, determines the exact response of the network.

CIRCUIT DESCRIPTION

Figure 3:
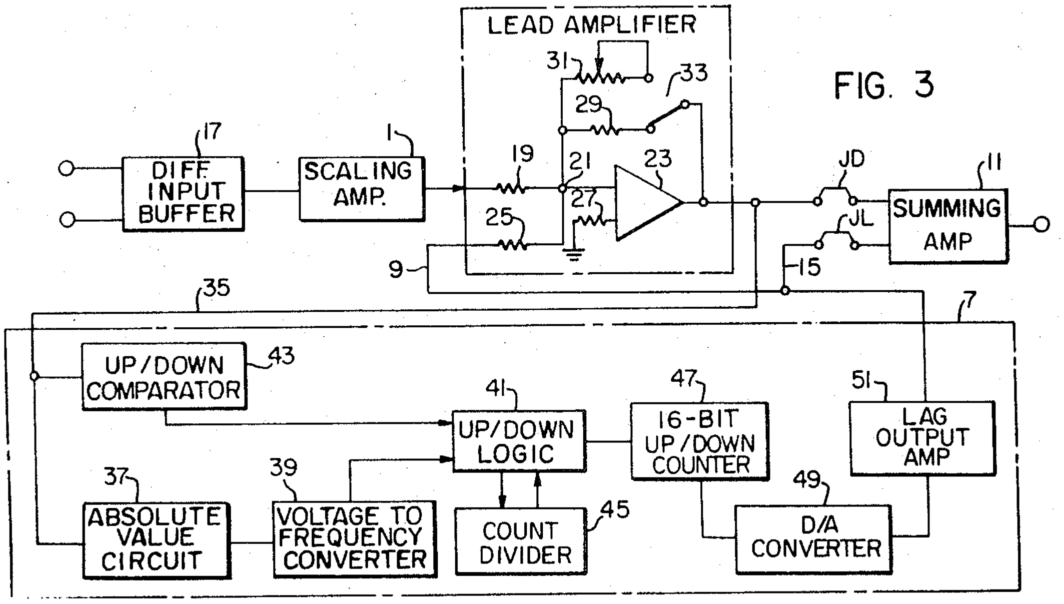
FIG. 3 is a more complete block diagram of the compensation network illustrated in FIG. 1.

FIG. 3 illustrates a more complete block diagram of the hybrid compensation network. A differential input buffer 17 may be used to convert a differential input signal to a bipolar signal which may be applied to the scaling amplifier 1. The scaling amplifier 1 is an operational amplifier provided with variable gain through adjustable resistive feedback. The gain of the scaling amplifier is equal to K and, as can be seen from the equations above, it is instrumental in determining the amplitude of the network output signal.

The output of the scaling amplifier 1 is applied through the resistor 19 to the summing junction 21 of operational amplifier 23. The signal on lead 9 is also applied to the summing junction 21 through input resistor 25. The other input to the operational amplifier 23 is connected through resistor 27 to ground. The output of the amplifier 23 is fed back to the summing junction 21 through either fixed resistor 29 or potentiometer 31 through the manually settable switch 33. The components enclosed within the dash-dot line may be referred to as the lead amplifier and they incorporate the error signal generator and the variable gain amplifier identified in FIG. 1 by the reference characters 3 and 5, respectively. The output signal of the scaling amplifier and the signal on lead 9 are of opposite polarity such that they are summed in opposition to each other at the summing junction 21.

The gain of the lead amplifier is *b* and is equal to the ratio of the feedback resistance to the input resistance. By setting the value of the fixed resistor 29 equal to that of resistors 19 and 25 which are of equal value, a gain of unity is readily available by moving the switch 33 to the position shown. By moving the switch to the up position and varying the slider on potentiometer 31, the gain *b* may be varied over a preselected range from below unity to many times unity, and in the exemplary circuit *b* is variable between .02 and 20.

The output of the amplifier 23 is applied to one input of the summing amplifier 11 through the jumper JD. The output of amplifier 23 is also applied through lead 35 to the input of the integrator, the components of which are enclosed within the block 7. The signal on lead 35 is applied through the absolute value circuit 37 to a voltage-to-frequency converter 39 which generates pulses at a frequency determined by the amplitude of the applied voltage. These pulses are applied to an up/down logic circuit 41 along with a direction signal generated by an up/down comparator 43 which is responsive to the sense of the signal appearing at the output of the amplifier 23. A count divider 45 selectively counts down in steps of two the pulses generated by the voltage-to-pulse converter. The selected pulses are applied to a sixteen bit reversible binary counter 47 which counts either up or down upon the command of the up/down logic 41. The accumulated count in the reversible counter 47 is converted to a voltage signal by the digital-to-analog converter 49. The unipolar output signal of the digital-to-analog converter is transformed into a bipolar signal by the lag output amplifier 51. The output of the integrator is applied through lead 15 and jumper JL to the second input to the summing amplifier 11 and through lead 9 and resistor 25 to the summing junction 21 of the lead amplifier.

Figure 4:
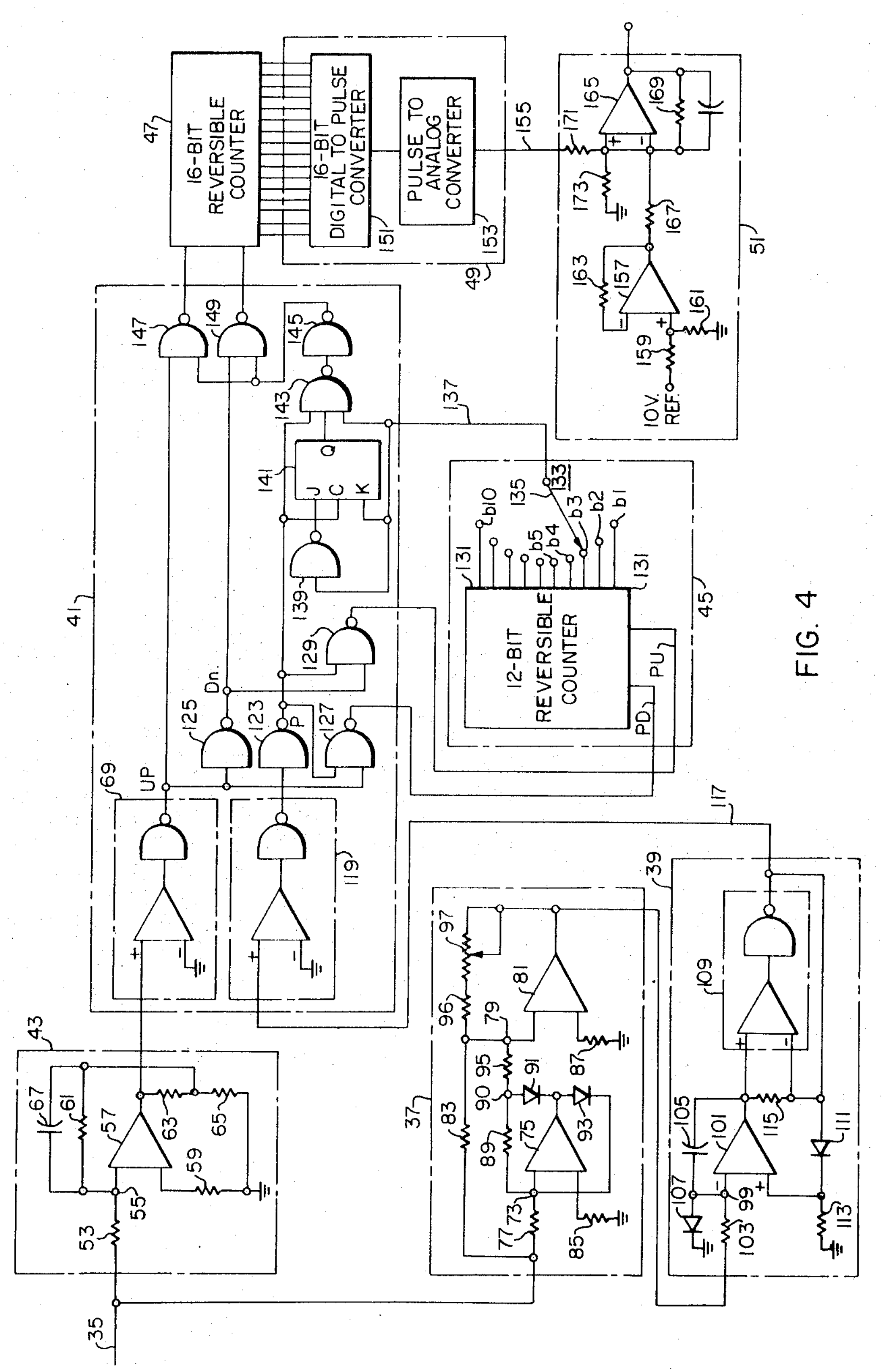
FIG. 4 is a schematic circuit diagram with portions in block diagram form of the digital integrator utilized in the networks of FIGS. 1 and 3.

A more complete schematic diagram of the integrator is shown in FIG. 4. The up/down comparator 43 is a very high gain amplifier stage in which the signal on lead 35 is applied through input resistor 53 to the summing junction 55 of an operational amplifier 57. The other input to the amplifier is connected to ground through resistor 59. The feedback resistor 61 is connected between the summing junction 55 and the tap point of the voltage divider formed by resistors 63 and 65 connected between the output of the operational amplifier and ground. It is well known that such a configuration gives high gain and in the exemplary circuit the gain is approximately five thousand. It can be seen then, that whenever the input signal to the up/down comparator goes either slightly positive or slightly negative, a saturating voltage of the opposite sense appears at the output. The capacitor 67 prevents oscillation of the circuit due to noise when a zero signal is applied.

The output of the amplifier 57 is applied to the non-inverting input of line receiver 69 in the up/down logic circuit 41. A suitable line receiver is Type 9622 manufactured by Fairchild Semiconductor, Inc. This device has a threshold of 1.5 volts. If the input is greater than +1.5 volts, the output will be a digital ZERO. If it is less than +1.5 volts, the output will be a digital ONE. Thus, it can be seen that for even a small positive signal on lead 35, the large negative signal appearing at the output of amplifier 57 will cause the output of line receiver 69 to go to ONE. As will be seen later, this ONE signal will be used to cause the reversible counter to count in the up direction.

The signal on lead 35 is also applied to the absolute value circuit 37. It is applied to the summing junction 73 of a first operational amplifier 75 through input resistor 77 and to the summing junction 79 of a second operational amplifier 81 through input resistor 83. The other inputs of amplifiers 75 and 81 are connected to ground through resistors 85 and 87, respectively. A feedback resistor 89 is connected between the output of the amplifier 75 and the summing junction 73. A diode 91 with its cathode connected to the output of amplifier 75 is connected in series with the resistor 89.

A second feedback loop for the amplifier 75 includes a diode 93 with its anode connected to the amplifier output. A resistor 95 connects the junction 90 between the feedback resistor 89 and the anode of diode 91 to the summing junction 79 of the second amplifier. The feedback loop of the second amplifier 81 includes resistor 96 and potentiometer 97. The resistors 77, 83 and 89 are each made equal to the value of the resistor 96 plus the full value of the potentiometer 97. The resistor 95 has half the value of this resistance. Therefore, it can be seen that the gain of amplifier 75 is one and that the gain of amplifier 81 is one with respect to an input signal applied through resistor 83 and two with respect to the output of amplifier 75 which is applied to amplifier 81 through resistor 95.

The operation of the absolute value circuit is as follows. With a positive input signal, a negative signal of equal amplitude will appear at junction 90 due to the inverting effect of the amplifier operated in the described mode. This negative signal, when applied to the input of amplifier 81, would by itself produce a positive output signal on amplifier 81 with an amplitude equal to twice that of the input signal due to the ratio of the feedback resistance to that of the resistor 95. However, the positive input signal is also applied to amplifier 81 through resistor 83. This signal by itself would produce a negative signal at the output of amplifier 81 having an amplitude equal to the amplitude of the input signal. The resulting signal, therefore, is a positive signal having an amplitude equal to the amplitude of the input signal.

If a negative input signal is applied to the circuit, the output of amplifier 75 will attempt to go positive but will be limited to the forward drop across diode 93 which shunts positive signals to the summing junction. Diode 91 is provided to match this forward drop across diode 93 so that the voltage of junction 90 which is applied to the second amplifier 81 is zero. At the same time, the negative input signal is applied to the amplifier 81 through resistor 83 and produces a positive output signal equal in amplitude to that of the input signal. It can be seen, therefore, that a positive signal having an amplitude equal to the amplitude of the input signal appears at the output of amplifier 81 regardless of the polarity of the input signal applied through lead 35.

The output of the absolute value circuit is applied to the summing junction 99 of an operational amplifier 101 in the voltage to frequency convert 39 through input resistor 103. A capacitor 105 is inserted in the feedback circuit of amplifier 101 and is also connected to ground through diode 107 the anode of which is connected to summing junction 99. The output of amplifier 101 is connected to the positive input of a line receiver 109. The output of the line receiver is connected to its own negative input, the non-inverting input of amplifier 101, and through diode 111 and resistor 113 to ground.

A resistor 115 is connected across the inputs of line receiver 109.

The operation of the voltage to frequency circuit can be understood by considering the point in time when the capacitor 105 is charged positively. The positive charge on the capacitor 105 forces the output of the line receiver 109 to ZERO. The positive signal applied to the summing junction 99 of amplifier 101 by the absolute value circuit will tend to drive the output of amplifier 101 negative, thus discharging the capacitor 105. The rate of the discharge is determined by the magnitude of the applied signal. When the potential on the output of amplifier 101 decays to +1.5 volts, a digital ONE signal will appear at the output of line receiver 109. This digital ONE signal is a +5 volts which is applied to the negative input of line receiver 109 to maintain it in the one state. The +5 volts from the line receiver is also applied to the non-inverting input of amplifier 101 which causes rapid charging of the capacitor 105 through diode 107. When the output of amplifier 101 reaches +6.5 volts so that the positive input to the line receiver 109 becomes 1.5 volts more positive than the negative input, the output of the line receiver will switch to ZERO. Thus, the circuit has returned to the initial state. The charging time of capacitor 105 is fixed and controls the width of the pulses generated at the output of line receiver 109. The interval between the pulses is determined by the magnitude of the signal applied through resistor 103. Since the pulse width is small compared to the interval between pulses, the rate at which pulses are generated is a function of the amplitude of the input signal applied on lead 35.

The pulses generated by the voltage to frequency converter 39 are applied through lead 117 to the positive input of line receiver 119. The output of line receiver 119 becomes the input to NAND element 123. Each pulse on line 117 will cause the output of the line receiver to go to ZERO, causing the NAND element 123 to go to ONE thereby generating pulses P.

The pulses P therefore appear at the output of NAND element 123 at a rate determined by the magnitude of the input signal applied through lead 35 regardless of the polarity of that signal. It will be recalled from the discussion above, however, that the output of line receiver 69 goes to a ONE whenever the input signal applied on lead 35 is positive. Thus, the signal generated by line receiver 69 is an UP signal. A DN signal is generated by applying the up signal to inverter 125. By gating NAND 127 with the UP signal, the output of this device will go to ZERO each time a pulse appears at the output of NAND 123 in response to a positive signal on lead 35. Similarly, with NAND 129 enables by the DN signal, the output of this element will go to ZERO for the duration of each pulse P when the input signal is negative. The outputs of NAND elements 127 and 129 are connected respectively to the count-up and count-down inputs of the reversible counter 131 in the count divider 45. Counter 131 is an ordinary reversible digital counter available in integrated circuit form. In the exemplary embodiment of the invention, a twelve bit counter is used and leads are individually connected between the 10 least significant bits on this counter and taps labeled b1 through b10 on a rotary switch 133. A wiper arm 135 can be rotated to connect any desired bit to lead 137.

Figure 5:
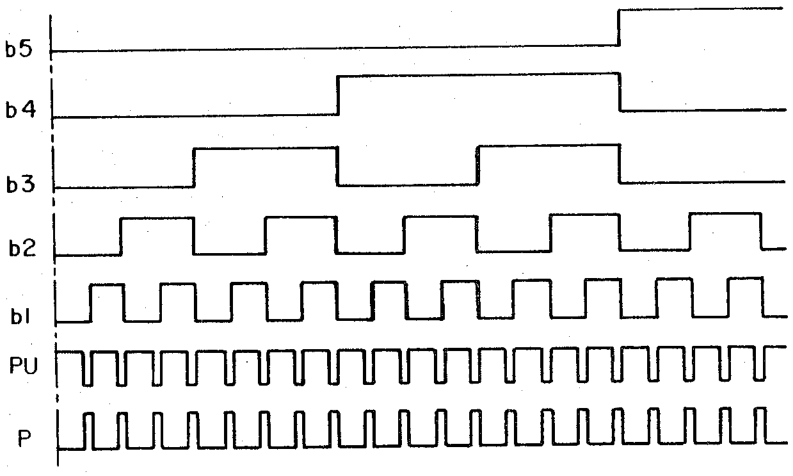
FIG. 5 is a composite waveform diagram of signals generated in a portion of a circuit of FIG. 4.

FIG. 5 illustrates the operation of the count divider. The pattern of pulses P appearing at the output of NAND 123 is illustrated by the waveform P. The signal applied to the count-up input of counter 131 for positive input signals is illustrated by the waveform PU. The counter 131 counts when the waveform PU goes positive which, it can be seen, occurs at the termination of pulses P. The waveforms appearing at the taps *b*1 through *b*5 on the rotary switch 33 are correspondingly labeled.

Waveform *b*1 shows that every other pulse causes the first bit of the counter 131 to go to ONE and the alternate bits return it to ZERO. In other words, the rate at which the first bit of the counter goes to ONE is one-half the rate at which the pulses are generated. The bit *b*2 goes to ONE the first time the bit *b*1 goes to ZERO and returns to ZERO the second time the bit *b*1 goes to ZERO. Thus, the bit *b*2 goes to ONE at one-half the rate that *b*1 goes to ONE or at one-fourth the rate at which the pulses are generated. Similarly, it can be seen that it takes eight pulses for bit *b*3 to complete a cycle, 16 pulses for *b*4, 32 pulses for *b*5 and so forth. In other words, a selected bit divides the pulses by 2 raised to the power equal to the number of the bit. Thus, it can be seen that for the tenth bit it will take 1,024 pulses to complete a cycle and that the tenth bit will be equal to ZERO for the first 512 pulses and then will be equal to ONE for the next 512 pulses. The pulses may be divided down as many times as it is desired by adding additional bits to the counter 131. In the exemplary circuit, ten bits was considered appropriate for the range of time constants desired.

An enabling ONE signal will appear on the output lead 137 of the count divider for the number of pulses selected by placement of the wiper arm 135 of the rotary switch 133. This count divider output signal is applied to the input of inverter 139, the K input to JK flip-flop 141 and to one input of the NAND element 143. The output of inverter 139 is applied to the J input of flip-flop 141. The pulse signal from NAND 123 and the Q output of the flip-flop serve as the other inputs to the NAND element 143. The pulse signal is also applied to the clock input C of the flip-flop. NAND 143 is connected through inverter 145 to NANDs 147 and 149. Additional inputs to NAND elements 147 and 149 include the UP and DN signals respectively. JK flip-flops are well known in the electronics field and therefore a detailed description of their operation is unnecessary.

Figure 6:
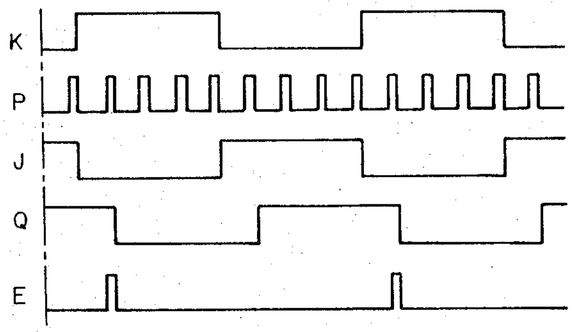
FIG. 6 is a composite waveform diagram of signals appearing in another portion of the circuit of FIG. 4.

For an understanding of this portion of the up/down logic circuit, consider that the wiper arm 135 of the rotary switch is set to the bit *b*3 as shown in FIG. 4. Referring to FIG. 6, assume that the bit 3 is equal to ZERO thereby applying a ZERO to the K input of flip-flop 141 through lead 137 and a ONE to the J input through inverter 139. The output Q of the flip-flop will be ONE at this time. With the signal on the lead 137 equal to ZERO, the output of NAND 143 cannot go to zero when a pulse P is generated. However, assume that the termination of the next pulse causes the third bit of the counter 131 to go to ONE. This will cause the K input to the flip-flop 141 to go to ONE and the J input to go to zero; however, the flip-flop cannot change state without a signal applied to the clock terminal C and, therefore, the Q output will remain equal to ONE.

Upon the occurrence of the next pulse P all three inputs of the NAND element 143 will be equal to one and its output will go to zero for the duration of the pulse P. This signal will be inverted by NAND 145 to produce the output enabling pulse E. The trailing edge of the pulse P activates the clock input of flip-flop 141. Since at this instant, a ONE is applied to the K input and a ZERO to the J input, the output Q will go to ZERO.

The onset of the next three pulses P have no effect on the circuit; however, the trailing edge of the third pulse causes the third bit of counter 131 to go to ZERO thereby applying a ZERO to the K input of flip-flop 141 and a ONE to the J input. Therefore, when the trailing edge of the next pulse P activates the clock input of flip-flop 141, the Q output goes to ONE. However, subsequent pulses cannot cause the signal E to go to ONE until the bit *b*3 of counter 131 is returned to a ONE.

The pulses E are applied to the NANDs 147 and 149. If the UP signal is equal to one, these pulses will be gated to the count up input of the sixteen-bit reversible counter 47. On the other hand, a DN signal will gate these pulses to the count-down input of the counter. Thus, it can be seen that by placing the wiper arm of the rotary switch 133 to the *b*3 position, one pulse is gated to the sixteen-bit reversible counter 47 for every eight pulses generated by the voltage to frequency converter. The selection of other bits on the twelve-bit reversible counter 131 will result in the gating of pulses to the 16-bit reversible counter 47 at a rate of P÷2 raised to the power of the bit selected. Hence, if bit 5 is selected, one pulse will be gated to the 16-bit reversible counter 47 for each 32 pulses P.

The 16-bit reversible counter 47 is a standard reversible counter now widely available in the form of integrated circuit modules and is provided with means to prevent roll-over at the upper and lower limits of the counter as is well known in the art and as discussed in the application of Thomas Schwalenstocker identified as reference 3, supra. The pulses gated to the counter 47 are stored as an accumulated count. This digital count is transformed into an analog voltage signal for use in other parts of the compensation network by the digital to analog converter 49. A suitable D to A converter is disclosed in the patent application of James Sutherland, identified above as reference 1. This converter employs a digital to pulse converter 151 which combines pulse rate modulation with pulse width modulation to convert the accumulated count in counter 47 to a pulse signal having a total pulse width equivalent to the magnitude of the stored count. A pulse to analog converter 153 then extracts the average DC component from this pulse signal to generate a zero to ten volt equivalent signal on lead 155. This zero to ten volt signal is applied to the lag output amplifier 51 which converts the zero to ten volt signal to a minus 12.5 to plus 12.5 volt signal.

In the lag output amplifier 51, a ten volt reference voltage applies five volts to the non-inverting input of operational amplifier 157 through the voltage divider comprising equal value resistors 159 and 161. Feedback resistor 163 connected to the inverting input gives the amplifier 157 a gain of one. The constant five-volt output of amplifier 157 is applied to the inverting input of operational amplifier 165 through resistor 167. A feedback resistor 169 gives the amplifier 165 a gain of 2.5. The zero to ten volt signal from the digital to analog converter is applied to the non-inverting input of amplifier 165 through a voltage divider comprising the resistors 171 and 173 connected between the pulse to analog converter and ground. Thus, with a zero to ten volt signal on lead 155, the output of amplifier 165 will vary from −12.5 volts to +12.5 volts with zero volts appearing on the output for a five-volt signal on lead 155. Hence, the unipolar signal generated in the integrator is converted to a bipolar output signal with the output being equal to zero volts when the 16-bit reversible counter 4 is half full.

Figure 7:
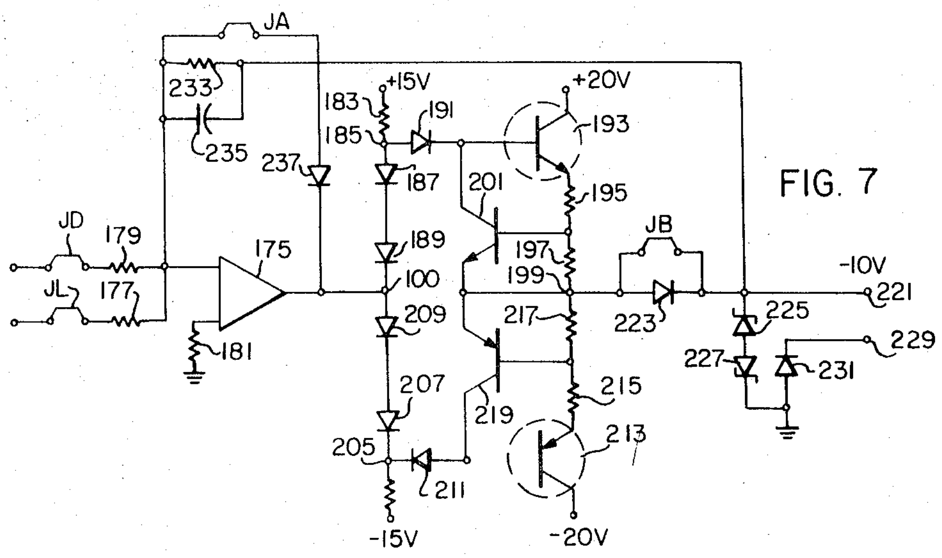
FIG. 7 is a schematic circuit diagram of an exemplary output summing amplifier used in the network of FIG. 3.

As will be recalled from the discussion above, the output signal of the integrator is applied through lead 9 to the lead amplifier and through the lead 15 and jumper JL to the summing amplifier 11. The circuit diagram of a suitable summing amplifier is illustrated in FIG. 7. This circuit provides either a unipolar or bipolar output signal with current limiting. The output of the integrator is applied to the summing junction of operational amplifier 175 through the jumper JL and input resistor 177. The output of the lead amplifier is also applied to the summing junction of amplifier 175 through jumper JD and resistor 179. The other input to the operational amplifier is connected through resistor 181 to ground. The current limiting circuit includes a resistor 183 connected between a +15 volt supply and a junction 185. A diode 187 having its anode connected to the junction 185 is connected in series with another diode 189 having its cathode connected to the output of operational amplifier 175. The junction 185 is also connected to the anode of another diode 191, the cathode of which is connected to the base of an npn transistor 193. The collector of transistor 193 is connected to a +20-volt supply voltage and the emitter is connected through resistors 195 and 197 to the junction 199. A second npn transistor 201 has its base connected between resistors 195 and 197, its collector connected to the base of transistor 193 and its emitter connected to the junction 199.

The negative portion of the current limiting circuit includes a resistor 203 connected between a −15 volt supply voltage and junction 205. The junction 205 is connected to the cathode of diode 207 which is in series with a diode 209 having its anode connected to the output of amplifier 175. Junction 205 is also connected to the cathode of diode 211, the anode of which is connected to the base of the pnp transistor 213. The collector of transistor 213 is connected to a −20 volt supply voltage and the emitter is connected through resistors 215 and 127 to the junction 199. Another pnp transistor 219 has its base connected to the junction between the resistors 215 and 217, its collector connected to the base of transistor 213 and its emitter connected to the junction 199. The transistors 193 and 213 are provided with heat sinks as indicated by the dashed circles.

The junction 199 is connected to the output terminal 221 through the anode to cathode circuit of diode 223. The diode 223 is shunted by a jumper JB. Back-to-back 10-volt zener diodes 225 and 227 are connected between the output terminal 221 and ground. The second output terminal 229 is connected through the cathode to anode circuit of diode 231 to ground. The feedback resistor 233 is connected between the output terminal 221 and the summing junction of the amplifier 175. A capacitor 235 in parallel with the feedback resistor provides six-cycle roll-off. A jumper JA connects the summing junction to the anode of a diode 237, the cathode of which is connected to the output of amplifier 175.

The operation of the summing amplifier may be explained as follows. For a −10 volt to +10 volt output signal, the jumper JB is installed and the jumper JA is removed. The signals from the integrator and the lead amplifier applied through the jumpers JL and JD, respectively, are summed at the summing junction of the amplifier 175. If the sum of the applied signals is zero, the output of amplifier 175 will also be zero. Under these circumstances, the voltage at junction 185 will be +1.2 volts and the voltage at junction 205 will be −1.2 volts due to the forward drops of the diodes 187, 189, 209 and 207. The base voltages on transistors 193 and 213 will be +.6 volts and −.6 volts, respectively, due to the forward drop through diodes 191 and 211. Under these circumstances, neither transistor 193 nor 213 will conduct and the voltage at function 199, and, therefore, terminal 221 will be zero.

If the sum of the lead and lag signal becomes positive, the output of amplifier 175 will become negative. This negative voltage will forward bias the transistor 213 causing it to conduct and thereby causing the junction 199 and, consequently, the output terminal 221 to go negative. If the output of amplifier 175 goes positive, transistor 213 will be cut off and transistor 193 will begin to conduct, thereby causing the junction 199 and the output terminal 221 to go positive. The transistors 193 and 213 are, therefore, connected as emitter followers and the diodes between the junctions 185 and 205, respectively, and the output of amplifier 175 are provided to match the forward drop across diodes 191 and 211 and the forward drop across the base to emitter junctions of the transistors so that the voltage at output terminal 221 closely follows the output of amplifier 175. The zener diodes 225 and 227 limit the output voltage to plus or minus 10.7 volts, respectively.

Short-circuit protection is provided by transistors 201 and 210. Should a short-circuit occur across the output terminals 221 and 229 while transistor 193 is conducting, the increased current through resistor 197 will turn on transistor 201 which will, in turn, reduce the base drive current to transistor 193. Similarly, transistor 219 will by turned on by the increased drop across resistor 217 if a short-circuit should be placed across the output terminals while transistor 213 is conducting. Again, this will reduce the base drive current to transistor 213 and thereby limit the output current. The parameters are selected such that the positive and negative short-circuit output currents are limited to forty milliamperes.

If a unipolar output signal is desired, the jumper JA is inserted and jumper JB is removed. Under these circumstances, positive resultant signals applied to the summing junction of amplifier 175 will be shorted to the output by diode 237. Actually, the forward drop across the diode 237 will permit the output of amplifier 175 to go to −.6 volts. This −.6 voltage will appear at junction 199. However, the forward drop of the diode 223 will cause the output voltage to be zero. If the circuit is to be used with instrumentation systems which provide an accurate zero to ten volt output by allowing the voltage to drop slightly below zero, the jumper JB may be replaced. The diode 231 will then serve as a clamp to insure that the output voltage does not go below −.6 volts.

It may be observed that the summing amplifier inverts the polarity of the applied signals. However, it can be appreciated from reference to FIG. 3 that since the differential input buffer 17, the scaling amplifier 1, and the lead amplifier are each inverting circuits, the output signal will be of the proper polarity.

CALCULATION OF THE CIRCUIT TIME CONSTANTS

Reference to the equations discussed above will show that the lead and lag time constants are a function of the time constants of the integrator. By definition, the time constant of the integrator is equal to the interval required for the integrator to generate an output signal equal in amplitude to that of the applied input signal, e.g., the time required to generate a one-volt output signal in response to a one-volt applied signal. Sincce the total count that may be accumulated in the sixteen-bit counter is $2^{16} = 65,536$ and since this count is translated into an output voltage span of −12.5 volts to +12.5 volts, it can be seen that a count of 2621 pulses represents one volt at the output. It can also be appreciated from this that a count of 32,768 or $2^8$ represents the zero volt point.

In the exemplary embodiment of the invention, the parameters of the voltage to frequency converter were selected to generate a frequency of approximately 51 kilohertz for a 10-volt input. Therefore, a frequency of 5100 pulses per second represents one volt at the input. However, it will be recalled that the pulses generated by the voltage to frequency converter are divided down by the count divider 45. From this it can be seen that the time required for the integrator to generate a one-volt output in response to an applied voltage can be determined by the following formula:

$$T_1 = 2621/5100 \cdot 2^x \quad (9)$$

where $x$ is the bit of the reversible counter selected by the wiper arm of the rotary selector switch. If the fraction in equation (9) is approximated to 1/2, the equation may be reduced to:

$$T_1 = 2^{x-1} \quad (10)$$

Thus, if the selector switch is set to read the first bit of the counter 131, $T_1$ will equal one second. Similarly, if bit 2 is selected, $T_1$ will equal two seconds, and for bit 3, $T_1$ will equal four seconds, etc. Therefore, $T_1$ may be varied from one second to one thousand seconds in steps which double the time constant. Of course the range selected is arbitrary and may be varied by adjusting the frequency of the voltage to frequency converter, the number of bits in either of the reversible digital counters and/or the gain of the lag output amplifier.

The output of the integrator can be made continuously variable by varying the gain of the absolute value circuit 37 in FIG. 4. For example, if resistors 73, 83 and 89 are made equal to 20k, the resistors 95 and 96 are made equal to 10k and, if the resistance of potentiometer 97 can be varied between 0 and 10k, the output $V_{AB}$ of amplifier 81 is:

$$V_{AB} = (10k + Rf)/20k\ Vin \quad (11)$$

or $$V_{AB} = ½\ Vin\ (1 + Rf/10k) \quad (12)$$

Therefore, the number of pulses generated by the voltage to frequency converter per volt is equal to:

$$\text{Pulses/volt} = 5100 \cdot \tfrac{1}{2}\ \text{Vin}(1 + Rf/10k) \quad (13)$$

Substituting this equation into equation (9), the time constant becomes:

$$T_1 = (2621/5100) \cdot 2^X\ (1 + Rf/10k) \quad (14)$$

If as above, the ratio 2621 to 5100 is taken to be equal to ½, then equation 14 becomes:

$$T_1 = 2^{X-1}(1 + Rf/10k) \quad (15)$$

According to this equation, if $x = 1$ and $Rf = 0$, $T_1 = 1$. If $Rf = 5k$, however, $T_1 = 1.5$. Thus, it can be seen that any time constant between one second and 1000 seconds can be selected by adjusting the wiper arm to the highest setting below the desired value and then adjusting the potentiometer 97 to obtain the exact time constant.

Reference to equation (2) shows that further flexibility in the selection of time constants may be had in varying the gain of the lead amplifier, $b$, since $T_2$ is equal to $T_1$ divided by $b$. Thus, if $b$ is made equal to ½, a time constant of 2000 seconds may be generated.

Time constants of such magnitude are not easily obtainable with the prior art resistor-capacitor integrators. As discussed previously, either very large value components are required or several components must be ganged in order to achieve such time constants in the prior art circuits. In any event, the best prior art integrators can only provide 10 percent accuracy for large time constants while the present circuit easily maintains an accuracy of five percent.

Another advantage of the present circuit is the ease of selecting a time constant. A continuous choice over the full range of time constants is available through the wiper arm of the rotary switch, and if needed, the potentiometer of the absolute value circuit. On the other hand, the prior art devices require switching between various capacitors and/or resistors. The switching of various capacitors in and out of the circuit causes discontinuities in the output of the prior art integrators. In the subject integrator, however, movement of the rotary switch or the absolute value circuit potentiometer, only results in a change in the slope of the output signal. Consequently, the time constant can be changed while the circuit is being utilized in an on line control system without causing unacceptable perturbations in the system.

Since the subject compensation network eliminates the need for large capacitors and resistors, it is readily adaptable to printed circuit board implementation. The reversible counters, the digital to analog converter, and the logic circuits are all easily implemented by integrated circuits which greatly reduces the size of the device. The entire network has been mounted on a single printed circuit card approximately six inches by 12 inches for mounting on edge in printed circuit racks with the time constant adjustments readily accessible at the front of the card. In this manner, a number of interchangeable compensation circuits adapted for similar or different functions may be provided within a limited space.

I claim as my invention:

1. A hybrid compensation network for applying electrical compensation to an applied signal comprising:
- an error signal generator having the applied signal connected to one input,
- a gain stage for applying gain to the output of the error signal generator,
- a feedback loop including a digital integrator connected between the output of the gain stage and the error signal generator, the output of said digital integrator being summed in opposition to the applied signal,
- a lead terminal connected to the output of the gain stage, and
- a lag terminal connected to the output of the digital integrator whereby a signal which leads the applied signal in phase may be extracted at the lead terminal and a signal which lags the input signal in phase may be extracted at the lag terminal.

2. The apparatus of claim 1 including means for adjusting the time constant of the digital integrator.

3. The apparatus of claim 2 wherein the digital integrator includes:
- a voltage-to-pulse converter operative to generate pulses at a frequency proportional to the magnitude of the output signal of the gain stage,
- a digital counter for accumulating a count of said pulses, and
- a digital-to-pulse converter for generating a voltage signal proportional to the accumulated count in said digital counter, said combination wherein the means for adjusting the time constant of said digital integrator includes means for adjusting the frequency of the pulses applied to the digital counter for a given input voltage to the integrator.

4. The apparatus of claim 3 wherein the means for adjusting the frequency of the pulses applied to the digital counter comprises a count divider connected between the voltage-to-pulse converter and the digital counter, said count divider being operative to divide down the pulses generated by the voltage-to-pulse converter in steps over an extended range.

5. The apparatus of claim 1 including means for adjusting the gain of the gain stage.

6. The apparatus of claim 1 including a summer, means connecting the lead terminal to one input of the summer, means counting the lag terminal to another input to the summer and a lead-lag terminal connected to the output of the summer.

7. The apparats of claim 6 wherein the gain of the gain stage is adjustable between a value which is less than unity and a value which is more than unity.

8. The apparatus of claim 7 including means for setting the gain of the gain stage to unity whereby the signal appearing at the lead-lag terminal will be a gain function of the applied signal.

9. The apparatus of claim 7 including means for adjusting the time constant of the intergrator.

10. A compensation network for applying compensation to an applied signal comprising:
- an error signal generator having the applied signal connected to a first input,
- a gain stage connected to the output of the error signal generator, an integrator having its input connected to the output of the gain stage and having its output connected to the error signal generator for summing in opposition to the input signal, a summer having a first input connected to the output of the variable gain stage and a second input connected to the output of the integrator, and an output terminal connected to the output of the summer.

11. The apparatus of claim 10 including means for disconnecting the output of the integrator from the second input of said summer whereby the signal appearing at the output terminal will be a lead function of the applied signal.

12. The apparatus of claim 10 including means for disconnecting the output of the gain stage from the first input to the summer whereby the signal appearing at the output terminal will be a lag function of the applied signal.

13. The apparatus of claim 10 including a scaling amplifier having the applied signal connected to its input and having its output connected to said first input of the error signal generator.

14. A compensation network for applying compensation to an applied signal comprising:

an error signal generator having the applied signal connected to one input, a gain stage connected to the output of the error signal generator, an integrator having its input connected to the output of the gain stage and having its output connected to the error signal generator for summing in opposition to the applied signal, a summer having first and second inputs and an output at which a signal is generated which is the algebraic sum of signals applied to its inputs, means for selectively connecting the output of the gain stage to said first input of said summer, and means for selectively connecting the output of the integrator to said second input of said summer.

15. The apparatus of claim 14 including means for adjusting the time constants in the network.

16. The apparatus of claim 15 wherein the means for adjusting the time constants in the network include means for varying the gain of the gain stage.

17. The apparatus of claim 15 wherein the means for adjusting the time constants in the network include means for adjusting the time constant of the integrator.

18. A method of applying compensation to an applied signal comprising the steps of:

summing the applied signal in opposition to a feedback signal to generate an error signal, integrating the error signal with respect to time to generate the feedback signal, and adding the error signal and the feedback signal to generate the compensated signal.

19. The method of claim 18 including the step of applying gain to the error signal before it is integrated and before it is added to the feedback signal.

20. The method of claim 19 including the step of selecting the time constant of the integrating step.

21. The method of claim 20 including the step of selecting the magnitude of the gain applied to the error signal.

22. A method of applying compensation to an applied signal including the steps of:

summing the applied signal in opposition to a feedback signal to generate an error signal, applying gain to the error signal to generate an amplified error signal, integrating the amplified error signal to generate the feedback signal, and selecting from the amplified error signal and the feedback signal the output signal.

23. The method of claim 22 including the step of digitally integrating the amplified error signal and varying the time constant of the integration by the steps of:

converting the amplified error signal to a pulse signal having a frequency proportional to the magnitude of the amplified error signal, selectively dividing down the pulses generated in steps over an extended range, accumulating a count of the divided down pulses, and, converting the accumulated count to a voltage signal.

24. The method of claim 23 including the step of varying the conversion ratio in converting the amplified error signal to pulses.

* * * * *